(12) United States Patent
Park et al.

(10) Patent No.: US 7,723,239 B2
(45) Date of Patent: May 25, 2010

(54) METHOD FOR FABRICATING CAPACITOR IN SEMICONDUCTOR DEVICE

(75) Inventors: Sang-Soo Park, Kyoungki-do (KR); Jung-Taik Cheong, Kyoungki-do (KR)

(73) Assignee: Hynix Semiconductor Inc, Kyoungki-Do (KR)

( * ) Notice: Subject to any disclaimer, the term of this patent is extended or adjusted under 35 U.S.C. 154(b) by 220 days.

(21) Appl. No.: 11/824,259

(22) Filed: Jun. 29, 2007

(65) Prior Publication Data

US 2008/0081429 A1  Apr. 3, 2008

(30) Foreign Application Priority Data

Sep. 29, 2006  (KR) .................. 10-2006-0096494

(51) Int. Cl.
*H01L 21/302* (2006.01)
(52) U.S. Cl. .................... 438/714; 438/710
(58) Field of Classification Search ............. 438/706, 438/710, 714
See application file for complete search history.

(56) References Cited

U.S. PATENT DOCUMENTS

| | | | |
|---|---|---|---|
| 6,838,388 B2 * | 1/2005 | Tadokoro et al. ............ 438/714 |
| 2004/0038546 A1 * | 2/2004 | Ko .............................. 438/710 |
| 2007/0141847 A1 * | 6/2007 | Pandhumsoporn et al. .. 438/706 |

FOREIGN PATENT DOCUMENTS

| | | |
|---|---|---|
| JP | 2002-110647 | 4/2002 |
| KR | 10-2001-0064072 | 7/2001 |
| KR | 1020040008646 | 1/2004 |

OTHER PUBLICATIONS

Office Action from KIPO dated May 22, 2008.

* cited by examiner

*Primary Examiner*—Bradley K Smith
(74) *Attorney, Agent, or Firm*—Blakely, Sokoloff, Taylor & Zafman, LLP

(57) ABSTRACT

A method for fabricating capacitor in a semiconductor device includes forming an sacrificial layer and over a substrate, forming a mask pattern over the sacrificial layer, etching the sacrificial layer in two steps with differentiated top and bottom power levels using the mask pattern as an etch mask to form an opening, and forming a bottom electrode over the opening.

12 Claims, 4 Drawing Sheets

METHOD FOR FABRICATING CAPACITOR IN SEMICONDUCTOR DEVICE

CROSS-REFERENCE TO RELATED APPLICATIONS

The present invention claims priority of Korean patent application number 2006-0096494, filed on Sep. 29, 2006 which is incorporated by reference in its entirety.

BACKGROUND OF THE INVENTION

The present invention relates to a method for fabricating a semiconductor device, and more particularly, to a method for fabricating a capacitor in semiconductor device.

The width (i.e., critical dimension (CD)) of a capacitor gets narrow due to the high integration of a semiconductor device. In other words, the size of an opening for a bottom electrode of a semiconductor device decreases.

FIGS. 1A and 1B are transmission electron microscopy (TEM) images showing a conventional capacitor in a semiconductor device. A sacrificial layer between the openings becomes thin because of a bowing profile in approximate mid regions of the openings. Referring FIG. 1B, a bottom critical dimension CD of the openings gets narrower compared to the width (i.e., CD) of each of the openings.

As the size of the openings decreases, the openings increasingly have a bowing profile due to the interference of a plasma for etching. As a result, capacitors, which are subsequently formed, are likely to be bridged together. Also, a lack of an etching margin causes the bottom CDs of the openings to decrease, and this decrease leads to the reduction in capacitor Cs of capacitors. However, in the case of etching a target layer/structure less to prevent the bowing profile formed by the interference of the plasma, the bottom CDs of the openings may increasingly decrease. On the other hand, in the case of etching the target layer/structure more to secure the bottom CDs of the openings, the bowing profile may become severe. Therefore, a method to overcome these two limitations needs to be developed.

SUMMARY OF THE INVENTION

Embodiments of the present invention are directed towards providing a method for fabricating a capacitor in a semiconductor device to reduce generation of a bowing profile and prevent decrease in a bottom critical dimension (CD) of an opening for a bottom electrode.

In accordance with an aspect of the present invention, there is provided a method for fabricating a capacitor in a semiconductor device. The method includes forming a sacrificial layer over a substrate, forming a mask pattern over the sacrificial layer, etching the sacrificial layer in two steps with differentiated top and bottom power levels using the mask pattern as an etch mask to form an opening, and forming a bottom electrode over the opening.

DESCRIPTION OF SPECIFIC EMBODIMENTS

Figure 2A:
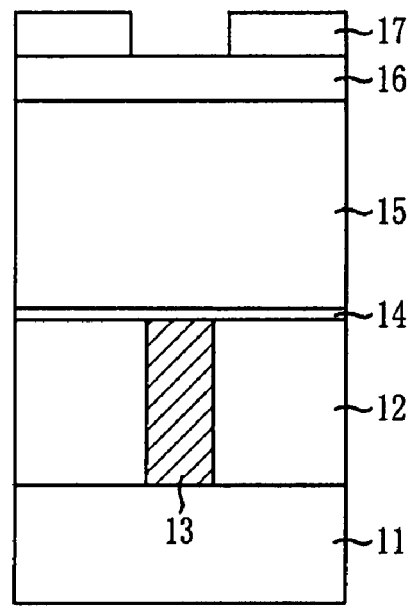
FIGS. 2A to 2D are cross-sectional views illustrating a method for fabricating a capacitor in a semiconductor device in accordance with an embodiment of the present invention.

FIGS. 2A to 2D are cross-sectional views illustrating a method for fabricating a capacitor in a semiconductor device in accordance with an embodiment of the present invention. Referring to FIG. 2A, an insulation layer 12 is formed over a substrate 11 where an isolation layer, a well and a gate pattern are already formed. The insulation layer 12 insulates interlayers, and is formed in a single-layer or multiple-layer structure using an oxide-based layer.

A storage node contact plug 13 penetrates the insulation layer 12. The storage node contact plug 13 is formed by etching the insulation layer 12 to form a contact hole (not shown) filling a conductive material in the contact hole, and planarizing the conductive material. For example, the conductive material includes a polysilicon.

An etch barrier layer 14 is formed over the above resultant profile including the insulation layer 12 and the storage node contact plug 13. The etch barrier layer 14 prevents damage of the insulation layer 12 and the storage node contact plug 13 when an opening for a bottom electrode is formed. The etch barrier layer 14 includes a material having a different selectivity to the insulation layer 12 and a subsequent sacrificial layer. For example, the etch barrier layer 14 includes a nitride layer. A sacrificial layer 15 is formed over the etch barrier layer 14. The sacrificial layer 15 is to define the aforementioned opening for the bottom electrode, and is formed, for an oxide layer. A hard mask layer 16 is formed over the sacrificial layer 15. The hard mask 16 functions as an etch barrier when the following sacrificial layer 15 is etched. A photoresist pattern 17 is formed over the hard mask layer 16. The photoresist pattern 17 is formed by photolithography to define the above mentioned opening for the bottom electrode.

Figure 2B:
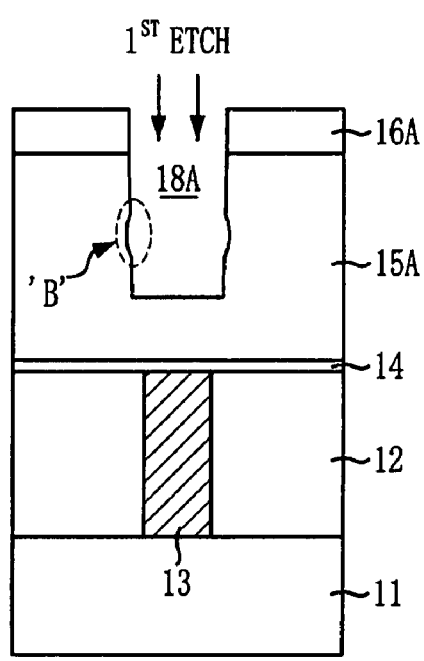

As shown in FIG. 2B, a hard mask pattern 16A is formed by etching the hard mask layer 16 using the photoresist pattern 17 as an etch mask. The photoresist pattern 17 is removed. The photoresist pattern 17 is removed by dry etching, for example, using oxygen. A first opening 18A is formed by etching the sacrificial layer 15 using the hard mask pattern 16A as an etch mask. Reference numeral 15A represents a first patterned sacrificial layer.

The first etch of the sacrificial layer 15 can prevent a damage on a top portion of the first opening 18A and secure a bottom critical direction (CD) by etching the sacrificial layer 15 without the loss of the hard mask pattern 16A. This effect can be achieved by increasing an etch selectivity ratio between the hard mask pattern 16A and the sacrificial layer 15. In detail, the first etch uses a capacitively coupled plasma (CCP) source and applies a pressure ranging from about 17 mTorr to 23 mTorr, a top power ranging from about 720 W to 880 W, a bottom power ranging from 1,080 W to 1,320 W. Particularly, the first etch applies the top power higher and the bottom power lower than a subsequent second etch to increase radicals or ions that perform the etching. As a result, the first etch proceeds as much as the bottom CD can be secured.

However, as the radicals or the ions increase, the collision with the sacrificial layer 15 increases, resulting in a bowing B in the first opening 18A. Also, the first etch is performed using a gas mixture including $C_4F_8$ and $C_4F_6$ gases, which are mixed at a ratio of about 7:11 as a main etch gas. $O_2$ gas and Ar gas are added to the gas mixture. The $O_2$ gas flows at a rate ranging from about 14 sccm.

The first etch is performed on about ⅗ of the whole sacrificial layer 15. For instance, the first etch takes about 170 seconds when the total etching time is about 275 seconds. Therefore, the bowing profile generated by the first etch is formed smaller than the bowing profile formed by performing one-step etching process on the opening for the bottom electrode.

Figure 2C:
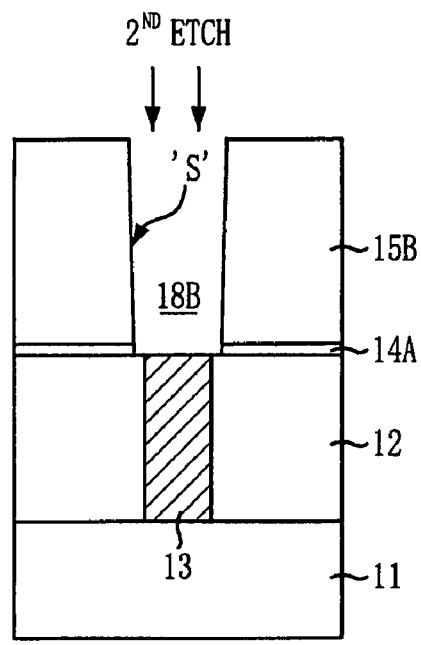

Referring to FIG. 2C, a second opening 18B for the bottom electrode is formed by performing a second etch on the patterned sacrificial layer 15A remaining underneath the first opening 18A. Reference numeral 15B and 14A represents a second patterned sacrificial layer and a patterned etch barrier layer, respectively. The second etch is performed applying a low top power and a high bottom power. This differential power levels from those of the first etch decreases the collision of the radicals or the ions on the patterned sacrificial layer 15A and increases directionality SO as to maintain the bottom CD secured from the first etch.

Also, by etching the hard mask pattern 16A and a part of the sacrificial layer 15 disposed above the bowing profile B generated from the first etch with a lowered the etch selectivity ratio between the patterned sacrificial layer 15A and the hard mask pattern 16A, the bowing profile B is changed into a sloped profile S. In detail of the second etching, the second etch uses a CCP source, which is substantially the same as the one used in the first etch and applies a pressure ranging from about 17 mTorr to 23 mTorr, a top power that is lower than the top power in the first etch, and a bottom power higher than the top power in the first etch. For instance, the top power in the second etch ranges from about 630 W to 770 W, and the bottom power layer from 1280 W to 1520 W. Also, the second etch uses a gas mixture including $C_4F_8$, $C_4F_6$ and $CF_4$, which are mixed at a ratio of about 14:14:15, as a main etch gas. By decreasing the ratio of carbon (C) to fluorine (F) compared to the F:C ratio in the first etch, the polymer generation and the etch selectivity ratio can be decreased. Thus, the bowing profile B can be changed into the sloped profiles.

$O_2$ and Ar gases are added to the above gas mixture. The $O_2$ gas flows at a rate ranging from about 21 sccm to 27 sccm that is more than the flow rate of the $O_2$ gas added in the first etch, and this increased flow rate of $O_2$ gas makes the polymer generation less. The second etch is performed on about ⅖ of the whole sacrificial layer 15 (see FIG. 2A). For instance, the first etch takes about 105 seconds when the total etching time is about 275 seconds. As described above, by removing the bowing profile B from the first opening 18A to provide the second opening 18B for the bottom electrode and securing the bottom power through the first and the second etch, a bridge between capacitors is not likely to be generated, and the capacitance Cs of the capacitor can be secured.

Figure 2D:
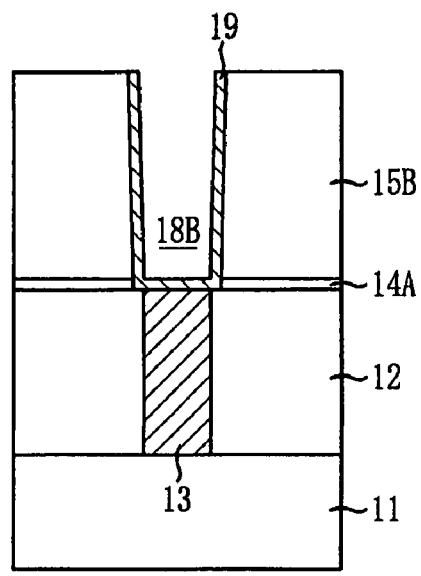

Referring to FIG. 2D, a bottom electrode 19 is formed over the second opening 18B. More particularly, a conductive material is formed over the resultant profile including the second opening 18B for and performing an isolation treatment on the conductive material to form the bottom electrode.

Figure 1A:
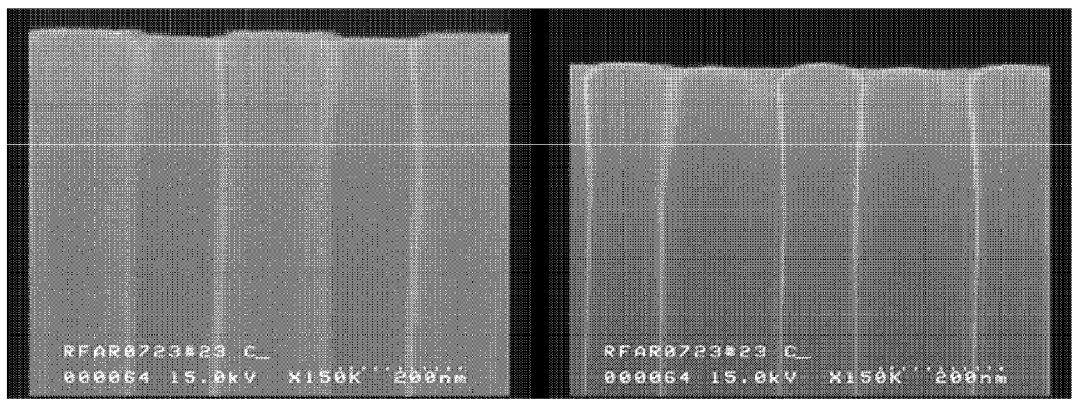
FIGS. 1A and 1B are transmission electron microscopy (TEM) images showing a conventional capacitor in a semiconductor device.
Figure 1B:
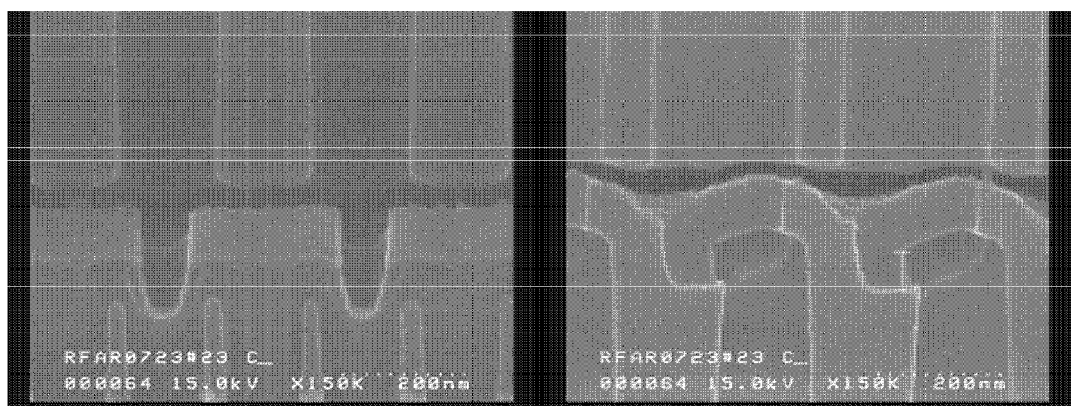
Figure 3:
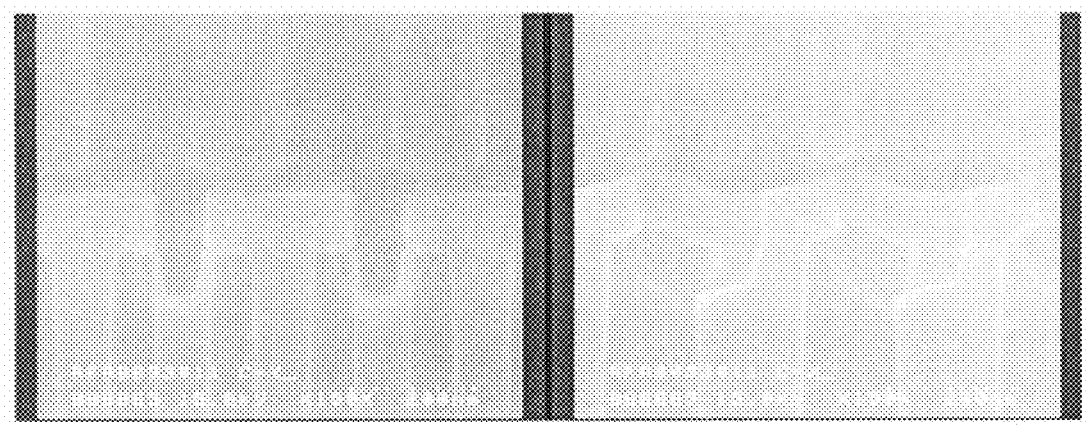
FIG. 3 illustrates a TEM image of a capacitor in a semiconductor device in accordance with an embodiment of the present invention.

FIG. 3 illustrates a TEM image of a capacitor in a semiconductor device in accordance with an embodiment of the present invention. According to the present embodiment, the bowing profile generation is decreased and the bottom CD of an opening is increased compared to the conventional approach illustrated in FIGS. 1A and 1B. The thickness of the sacrificial layer is about 470 Å in FIG. 1A and about 510 Å in FIG. 3. Thus, the thickness of the sacrificial layer in the present embodiment is about 40 Å thicker. Also, the bottom CD of the opening is about 850 Å in FIG. 1B, while bottom CD thereof is 920 Å in FIG. 3. Thus, the bottom CD of the opening in the present embodiment is about 70 Å wider.

The thickness of the sacrificial layer is about 40 Å thicker and the bottom CD of the opening for the bottom electrode is about 70 Å wider in the present embodiment. Hence, capacitors which are to be subsequently formed are not bridged together while securing a desired level of bottom CD. Accordingly, securing the capacitance of the capacitor is possible.

According to the embodiments of the present invention, the etching is performed in two steps with differentiated top and bottom power levels. More particularly, the first etch that allows securing of the bottom CD proceeds with applying the high top power and the low bottom power. The second etch that can prevent the bowing profile and generation and securing of the bottom CD proceeds with applying the top power lower and the bottom power higher than the respective top and bottom powers in the first etch. Due to the differently applied top and bottom power levels in the first and second etch, forming of bridges between capacitors caused by the bowing profile can be reduced, and simultaneously securing the bottom CD of the opening for the bottom electrode is possible. As a result, the capacitor capacitance can be secured.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a capacitor in a semiconductor device, comprising:
   forming a sacrificial layer over a substrate;
   forming a mask pattern over the sacrificial layer;
   etching the sacrificial layer in two steps with differentiated top and bottom power levels using the mask pattern as an etch mask to form an opening; and
   forming a bottom electrode over the opening,
   wherein the etching the sacrificial layer in two steps comprises:
   performing a first etch on the sacrificial layer applying a high top power and a low bottom power; and
   performing a second etch on a portion of the sacrificial layer applying a top power lower than the top power in the first etch and a bottom power higher than the bottom power in the first etch,
   wherein the first etch is performed with a top power ranging from about 720 W to 880 W and a bottom power ranging from about 1,080 W to 1,320 W.

2. The method of claim 1, wherein the first etch uses a gas mixture including $C_4F_8$ and $C_4F_6$ gases as a main etch gas.

3. The method of claim 2, wherein the $C_4F_8$ gas and the C4F6 gas are mixed in a ratio of about 7:11.

4. The method of claim 2, wherein the gas mixture is added with $O_2$ gas and Ar gas.

5. The method of claim 4, wherein the $O_2$ gas added to the gas mixture has a flow rate ranging from about 14 sccm to 18 sccm.

6. The method claim 1, wherein the second etch is performed with a top power ranging from about 630 W to 770 W and a bottom power ranging from about 1,280 W to 1,520 W.

7. The method of claim 6, wherein the second etch is performed using a gas mixture including $C_4F_8$, $C_4F_6$, and $CF_4$ gases.

8. The method of claim 7, wherein the $C_4F_8$ gas, the $C_4F_6$ gas and the $CF_4$ gas are mixed in a ratio of about 14:14:15.

9. The method of claim 7, wherein the gas mixture is added with $O_2$ gas and Ar gas.

10. The method of claim 9, wherein the $O_2$ gas has a flow rate ranging from about 21 sccm to 27 sccm.

11. The method of claim 1, wherein the first etch and the second etch are performed with a pressure ranging from about 17 mTorr to 23 mTorr.

12. The method of claim 1, wherein the forming the bottom electrode comprises:

forming a conductive layer over the opening; and isolating the conductive layer to form the bottom electrode.

* * * * *